US009998123B2

United States Patent
Jung et al.

(10) Patent No.: US 9,998,123 B2
(45) Date of Patent: Jun. 12, 2018

(54) IMPEDANCE CALIBRATION DEVICE FOR SEMICONDUCTOR DEVICE

(71) Applicants: SK hynix Inc., Icheon (KR); NORTHEASTERN UNIVERSITY, Boston, MA (US)

(72) Inventors: Hae Kang Jung, Gwangmyeong (KR); Yong Bin Kim, Franklin, MA (US)

(73) Assignees: SK HYNIX INC., Icheon (KR); NORTHEASTERN UNIVERSITY, Boston ( * ) Notice: Subject to any disclaimer, the term of this patent is extended or adjusted under 35 U.S.C. 154(b) by 58 days.

(21) Appl. No.: 15/169,295

(22) Filed: May 31, 2016

(65) Prior Publication Data

US 2017/0346466 A1 Nov. 30, 2017

(51) Int. Cl.
*H03L 5/00* (2006.01)
*H03K 19/20* (2006.01)
*H03K 19/00* (2006.01)

(52) U.S. Cl.
CPC .......... *H03K 19/20* (2013.01); *H03K 19/0005* (2013.01)

(58) Field of Classification Search
CPC ............ H04L 25/0278; H04L 25/0298; H04L 25/028; H03K 19/0005; G06F 13/4086
USPC .................................. 327/308, 108; 326/30
See application file for complete search history.

(56) References Cited

U.S. PATENT DOCUMENTS

| 6,437,610 | B1* | 8/2002 | Schrodinger | H03K 19/00384 326/30 |
| 6,798,237 | B1* | 9/2004 | Wang | H04L 25/0278 326/30 |
| 7,282,955 | B2* | 10/2007 | Kim | G11C 7/1057 326/30 |
| 9,106,222 | B2* | 8/2015 | Kao | H04L 25/0278 |
| 2003/0080891 | A1* | 5/2003 | Nagano | H04L 25/0272 341/155 |
| 2003/0171909 | A1* | 9/2003 | Inomoto | H03K 19/00369 703/23 |

FOREIGN PATENT DOCUMENTS

KR   10-2010-0040217 A   4/2010

* cited by examiner

*Primary Examiner* — Quan Tra

(57) ABSTRACT

An impedance calibration device for a semiconductor device includes a process sensor that detects a process condition for the semiconductor device and outputs a process signal, a temperature monitoring sensor that detects a temperature of the semiconductor device and outputs a temperature signal, a converter that converts the process signal and the temperature signal into a digital signal, and a code generation circuit that generates and outputs a driving code for controlling a level of a voltage at an output node according to the digital signal of the converter and a data signal. The impedance calibration device further includes an output driver that pulls up or pulls down the voltage at the output node according to the driving code.

20 Claims, 7 Drawing Sheets

| Rterm | R(PU)/R(PD) | PUC0/PDC0 | PUC1/PDC1 | PUC2/PDC2 | PUC3/PDC4 | PUC4/PDC4 | PUC5/PDC5 |
|---|---|---|---|---|---|---|---|
| 240 | 480/240 | 1 | 0 | 0 | 0 | 0 | 0 |
| 120 | 240/120 | 1 | 1 | 0 | 0 | 0 | 0 |
| 80 | 160/80 | 1 | 0 | 1 | 0 | 1 | 0 |
| 60 | 120/60 | 1 | 1 | 1 | 1 | 0 | 0 |
| 48 | 96/48 | 1 | 1 | 1 | 1 | 1 | 0 |
| 40 | 80/40 | 1 | 1 | 1 | 1 | 1 | 1 |

FIG.3

IMPEDANCE CALIBRATION DEVICE FOR SEMICONDUCTOR DEVICE

BACKGROUND

1. Technical Field

Embodiments relate to an impedance calibration device for a semiconductor device, and more particularly, to an impedance calibration device capable of adaptively and actively controlling the characteristics of an output driver according to a process change and a temperature change.

2. Related Art

In a semiconductor memory device, data signals transmitted along a transmission line may be reflected at the end of the transmission line. The reflected data signals may degrade the quality of the transmitted data signals. In order to reduce the reflection of the data signals, a termination resistor is coupled to the end of the transmission line. The termination resistor reduces the reflection of the data signals by matching internal impedance with the external impedance of a memory system. Such a termination resistor may be used in a DRAM (Dynamic Random Access Memory) having a fast operation speed.

Recently, as the operation speed of a memory device increases, impedance matching becomes more important. Accordingly, in high speed data transmission, a new impedance calibration method providing high signal quality and stability is desirable.

SUMMARY

Various embodiments are directed to a device capable of actively controlling the characteristics of an output driver of a semiconductor device in real time.

An impedance calibration device for a semiconductor device according to various embodiments includes: a process sensor configured to detect a process condition for the semiconductor device and output a process signal; a temperature monitoring sensor configured to detect a temperature of the semiconductor device and output a temperature signal; a converter configured to convert the process signal and the temperature signal into a digital signal; a code generation circuit configured to generate and output a driving code for controlling a level of a voltage at an output node according to the digital signal of the converter and a data signal; and an output driver configured to pull up or pull down the voltage at the output node according to the driving code.

According to an embodiment, it is possible to actively control the characteristics of an output driver of a semiconductor device in real time while minimizing power consumption.

BRIEF DESCRIPTION OF THE DRAWINGS

FIG. 3 is a table including values of driving control codes for generating target output impedance values according to an embodiment.

DETAILED DESCRIPTION

Figure 1:
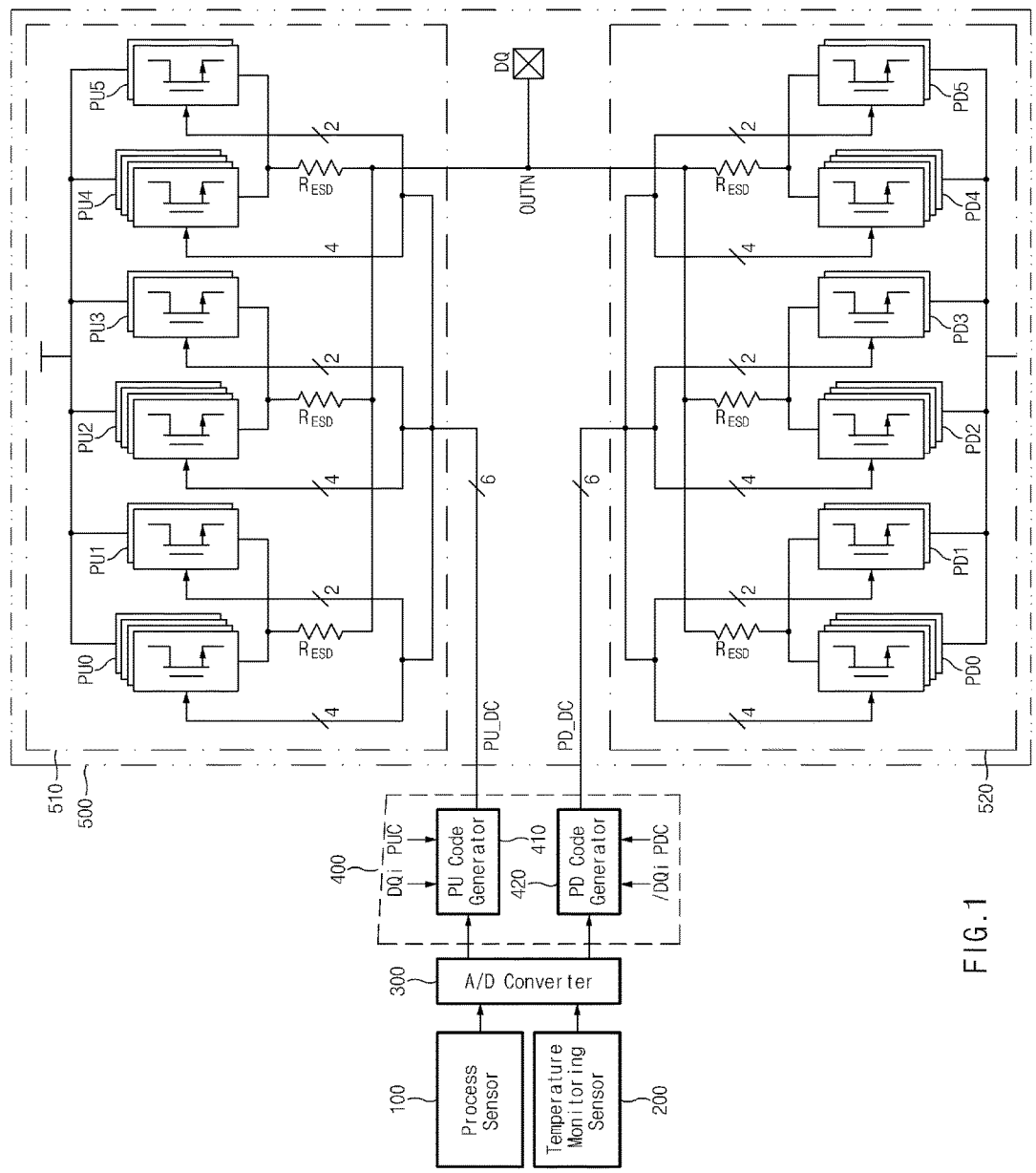
FIG. 1 is a block diagram illustrating an impedance calibration device according to an embodiment.

Hereinafter, various embodiments will be described below with reference to the accompanying drawings. The same reference numerals are used for the same elements in the drawings and a description of the same elements will be omitted in order to avoid redundancy.

FIG. 1 is a block diagram illustrating an impedance calibration device according to an embodiment. For illustrative convenience, FIG. 1 illustrates a single data pad DQ.

The impedance calibration device of FIG. 1 may include a process sensor 100, a temperature monitoring sensor 200, an analog/digital (A/D) converter 300, a code generation circuit 400, and an output driver 500.

The process sensor 100 detects process conditions for a semiconductor device and outputs analog signals (or process signals) indicative of the detected process conditions. An element (for example, an n-type metal-oxide-semiconductor field-effect transistor (NMOSFET)) included in the semiconductor device may have various characteristic values (for example, a threshold voltage) according to process conditions (for example, slow/typical/fast). Accordingly, the process sensor 100 detects such characteristic values of elements included in the semiconductor device and outputs analog signals indicative of corresponding process conditions. In an embodiment, process conditions of an output driver element (e.g., an NMOSFET) may be classified into three categories (e.g., slow, typical, and fast process corners) and the process sensor 100 outputs an analog signal corresponding to any one of the three process conditions. In an embodiment, one process sensor 100 may be included in a single die, so that process conditions detected by the process sensor 100 may be shared and used by one or more of output drivers in the die. Such a process sensor 100 should operate substantially independently of a temperature and a supply voltage.

The temperature monitoring sensor 200 detects a temperature of the output driver 500 and outputs a temperature signal indicative of the detected temperature. One temperature monitoring sensor 200 may be included in a single bank. An operation of the temperature monitoring sensor 200 may be substantially insensitive to processes and supply voltages.

The A/D converter 300 converts the analog signals output from the process sensor 100 and the temperature monitoring sensor 200 into digital signals, and outputs the digital signals. FIG. 1 illustrates the A/D converter 300 as a single element. However, in another embodiment, the A/D converter 300 may be divided into a first portion for converting the output signal of the process sensor 100 into a first digital signal and a second portion for converting the output signal of the temperature monitoring sensor 200 into a second digital signal.

The code generation circuit 400 generates pull-up and pull-down driving codes PU_DC and PD_DC for adjusting a voltage level of an output node OUTN by using the output signals of the A/D converter 300 and data signals DQi and /DQi. In an embodiment, the code generation circuit 400 receives pull-up and pull-down driving control signals PUC and PDC that have been set according to a reference impedance (e.g., a reference impedance according to the Joint Electron Device Engineering Council (JEDEC) standards), and outputs the driving codes PU_DC and PD_DC based on the received driving control signals PUC and PDC. As a result, the impedance (e.g., termination impedance) of the output node OUTN may match the reference impedance. For example, in order to match output impedance of the output node OUTN to the reference impedance of the JEDEC, the code generation circuit 400 selectively operates one or more of transistor arrays based on the driving control signals PUC and PDC. In an embodiment, the driving control signals PUC and PDC may have values that are preset such that they correspond to one or more values of the reference impedance defined by the JEDEC according to a semiconductor memory device. The preset values may be stored in the form of a look-up table (for example, a table of FIG. 3). Setting of values of such driving control signals PUC and PDC will be described later in more detail with reference to FIG. 3. Furthermore, the code generation circuit 400 adjusts ON/OFF states of the one or more transistor arrays selected based on the driving control signals PUC and PDC by using the output signal of the A/D converter 300 and the data signals DQi and /DQi, in order to compensate for a change (e.g., a change due to variations in temperature and process conditions) in the level of an output voltage at an output node OUTN, which is indicative of data transmitted through a data pad DQ. For example, the code generation circuit 400 decodes the output signal of the A/D converter 300 to generate a calibration code, performs logical operations on the calibration code and the data signals DQi and /DQi, and applies the signal resulting from the logical operations to gates of the one or more transistor arrays selected based on the driving control signals PUC and PDC, thereby adjusting the level of the output voltage transmitted through the data pad DQ. That is, in an embodiment, when the output impedance of the output driver 500 has been adjusted according to the reference impedance of the JEDEC, the code generation circuit 400 outputs data through the data pad DQ and adjusts the level of the output voltage in real time to compensate for a change of the level of the output voltage due to variations in temperature and process conditions, by using the output values of the process sensor 100 and the temperature monitoring sensor 200. Such a code generation circuit 400 may include a pull-up (PU) code generator 410 that generates a pull-up driving code PU_DC for driving a pull-up driver 510 according to the output signal of the A/D converter 300, the pull-up driving control signal PUC, and the data signal DQi. The code generation circuit 400 may further include a pull-down (PD) code generator 420 that generates a pull-down driving code PD_DC for driving a pull-down driver 520 according to the output signal of the A/D converter 300, the pull-down driving control signal PDC, and the inverted data signal /DQi.

The output driver 500 includes pull-up transistor arrays PU0 to PU5 coupled in parallel to one another and pull-down transistor arrays PD0 to PD5 coupled in parallel to one another, and turns the pull-up and pull-down transistor arrays PU0 to PU5 and PD0 to PD5 on and/or off according to the pull-up and pull-down driving codes PU_DC and PD_DC, respectively, thereby pulling up or down a level of a voltage at the output node OUTN to output data. In an embodiment, the output driver 500 receives the driving codes PU_DC and PD_DC for selectively driving a part or the whole of the pull-up transistor arrays PU0 to PU5 and the pull-down transistor arrays PD0 to PD5, respectively, according to target output impedance. Such an output driver 500 may include a pull-up driver 510 that pulls up the level of the voltage at the output node OUTN according to the pull-up driving code PU_DC and a pull-down driver 520 that pulls down the level of the voltage at the output node OUTN according to the pull-down driving code PD_DC. The pull-up driver 510 includes three resistors $R_{ESD}$ each having one end coupled to the output node OUTN, first pull-up transistor arrays PU0, PU2, and PU4 each coupled between the other end of a corresponding resistor $R_{ESD}$ and a power supply voltage VDD, and three second pull-up transistor arrays PU1, PU3, and PU5 respectively coupled in parallel to the first pull-up transistor arrays PU0, PU2, and PU4. The pull-down driver 520 includes three resistors $R_{ESD}$ each having one end coupled to the output node OUTN, three first pull-down transistor arrays PD0, PD2, and PD4 each coupled between the other end of a corresponding resistor $R_{ESD}$ and a ground voltage VSS, and three second pull-down transistor arrays PD1, PD3, and PD5 respectively coupled in parallel to the first pull-down transistor arrays PD0, PD2, and PD4.

Figure 2:
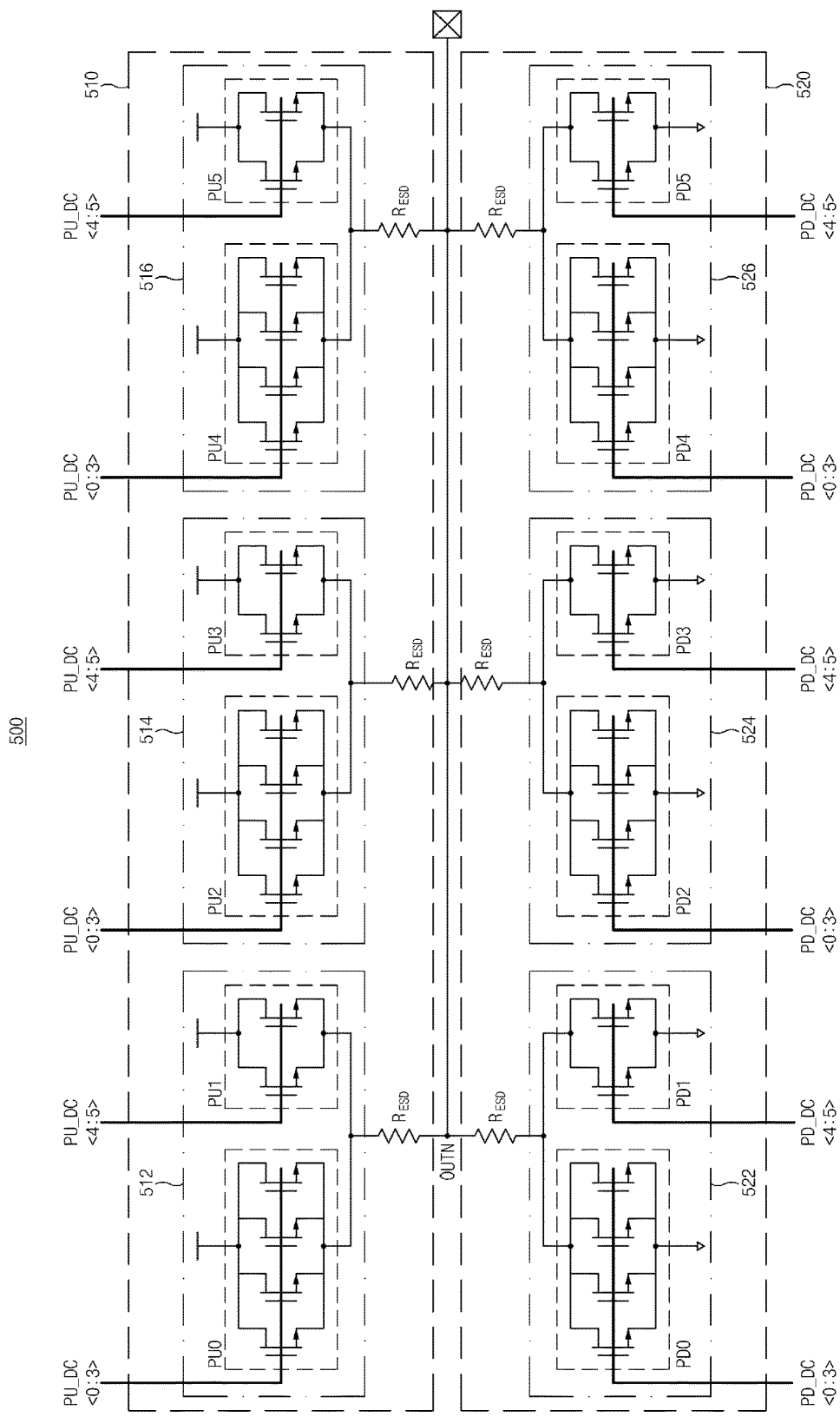
FIG. 2 is a circuit diagram illustrating an output driver of the impedance calibration device shown in FIG. 1 according to an embodiment.

FIG. 2 is a circuit diagram illustrating the output driver 500 shown in FIG. 1 according to an embodiment.

The output driver 500 includes a pull-up driver 510 coupled between a power supply voltage VDD and an output node OUTN and a pull-down driver 520 coupled between a ground voltage VSS and the output node OUTN.

The pull-up driver 510 includes three resistors $R_{ESD}$ each having one end coupled to the output node OUTN, three first pull-up transistor arrays PU0, PU2, and PU4, and three second pull-up transistor arrays PU1, PU3, and PU5. Each of the first pull-up transistor arrays PU0, PU2, and PU4 includes four transistors coupled in parallel to one another and disposed between a corresponding resistor $R_{ESD}$ and the power supply voltage VDD. Each of the second pull-up transistor arrays PU1, PU3, and PU5 includes two transistors coupled in parallel to each other and disposed between a corresponding resistor $R_{ESD}$ and a power supply voltage VDD.

In an embodiment, one first pull-up transistor array PU0, PU2, or PU4 and one corresponding second pull-up transistor array PU1, PU3, or PU5 together form one of pairs 512, 514, and 516, and are coupled in parallel to each other and disposed between a corresponding resistor $R_{ESD}$ and the power supply voltage VDD. Hereinafter, for convenience of description, the pairs of pull-up transistor arrays 512, 514, and 516 will be referred to as sub-pull-up drivers.

Each of the first, second, and third sub-pull-up drivers 512, 514, and 516 receives a 6-bit pull-up driving code PU_DC <0:5>, wherein a 4-bit portion PU_DC <0:3> of the pull-up driving code PU_DC <0:5> may be applied to the first pull-up transistor arrays PU0, PU2, and PU4 and the remaining 2-bit portion PU_DC <4:5> of the pull-up driving code PU_DC <0:5> may be applied to the second pull-up transistor arrays PU1, PU3, and PU5. In an embodiment, whether the 4-bit portion PU_DC <0:3> or the 2-bit portion PU_DC <4:5> is applied to a corresponding pull-up transistor array PU0, PU1, PU2, PU3, PU4, or PU5 is determined based on the pull-up driving control signal PUC. That is, each of the pull-up transistor arrays PU0 to PU5 may receive a corresponding portion PU_DC <0:3> or PU_DC <4:5> of the driving code PU_DC <0:5> depending on a corresponding value of the pull-up driving control signal PUC.

In an embodiment, each of the first pull-up transistor arrays PU0, PU2, and PU4 is configured to have a resistance value substantially equal to 440Ω when all the transistors in a corresponding pull-up transistor array PU0, PU2, or PU4 are turned on, and each of the second pull-up transistor arrays PU1, PU3, and PU5 is configured to have a resistance value substantially equal to 366Ω when all the transistors in a corresponding pull-up transistor array PU1, PU3, or PU5 are turned on. Accordingly, each of the sub-pull-up drivers 512, 514, and 516 is configured to have a resistance value substantially equal to 200Ω when all the transistors in a corresponding sub-pull-up driver 512, 514, or 516 are turned on. The resistor $R_{ESD}$ is configured to have a resistance value substantially equal to 40Ω.

Thus, the total impedance of the pull-up driver 510 may be set to be substantially equal to any one of 80 Ω, 96 Ω, 120 Ω, 160 Ω, 240Ω, and 480Ω according to a number of the pull-up transistor arrays PU0 to PU5 that are turned on. For example, when only a first pull-up transistor array PU0 is turned on and second to sixth pull-up transistor arrays PU1 to PU5 are turned off, the total impedance of the pull-up driver 510 is substantially equal to 480Ω. When the first pull-up transistor array PU0 and the second pull-up transistor array PU1 are turned on and the third to sixth pull-up transistor arrays PU2 to PU5 are turned off, the total impedance of the pull-up driver 510 is substantially equal to 240Ω. When all the pull-up transistor arrays PU0 to PU5 are turned on, the total impedance of the pull-up driver 510 is substantially equal to 80Ω.

The pull-down driver 520 includes three resistors $R_{ESD}$ each having one end coupled to the output node OUTN, three first pull-down transistor arrays PD0, PD2, and PD4, and three second pull-down transistor arrays PD1, PD3, and PD5. Each of the first pull-down transistor arrays PD0, PD2, and PD4 includes four transistors coupled in parallel to one another and disposed between a corresponding resistor $R_{ESD}$ and a ground voltage VSS. Each of the second pull-down transistor arrays PD1, PD3, and PD5 includes two transistors coupled in parallel to each other and disposed between a corresponding resistor $R_{ESD}$ and the ground voltage VSS.

In an embodiment, one first pull-down transistor array PU0, PU2, or PU4 and one corresponding second pull-down transistor array PU1, PU3, or PU5 together form one of pairs 522, 524, and 526, and are coupled in parallel to each other and disposed between a corresponding resistor $R_{ESD}$ and the ground voltage VSS. Hereinafter, for convenience of description, the pairs of pull-down transistor arrays 522, 524, and 526 will be referred to as sub-pull-down drivers.

Each of the first, second, and third sub-pull-down drivers 522, 524, and 526 receives a 6-bit pull-down driving code PD_DC <0:5>, wherein a 4-bit portion PD_DC <0:3> of the pull-down driving code PD_DC <0:5> may be applied to the first pull-down transistor arrays PD0, PD2, and PD4 and the remaining 2-bit portion PD_DC <4:5> of the pull-down driving code PD_DC <0:5> may be applied to the second pull-down transistor arrays PD1, PD3, and PD5. In an embodiment, whether the 4-bit portion PD_DC <0:3> or the 2-bit portion PD_DC <4:5> is applied to a corresponding pull-down transistor array PD0, PD1, PD2, PD3, PD4, or PD5 is determined based on the pull-down driving control signal PDC. That is, each of the pull-down transistor arrays PD0 to PD5 may receive a corresponding portion PD_DC <0:3> or PD_DC <4:5> of the pull-down driving code PD_DC <0:5> depending on a corresponding value of the pull-down driving control signal PDC.

In an embodiment, each of the first pull-down transistor arrays PD0, PD2, and PD4 is configured to have a resistance value substantially equal to 200Ω when all the transistors in a corresponding pull-down transistor array PD0, PD2, or PD4 are turned on, and each of the second pull-down transistor arrays PD1, PD3, and PD5 is configured to have a resistance value substantially equal to 133Ω when all the transistors in a corresponding pull-down transistor array PD1, PD3, or PD5 are turned on. Accordingly, each of the sub-pull-down drivers 522, 524, and 526 is configured to have a resistance value substantially equal to 80Ω when all the transistors in a corresponding sub-pull-down driver 522, 524, or 526 are turned on. The resistor $R_{ESD}$ is configured to have a resistance value substantially equal to 40Ω.

Thus, the total impedance of the pull-down driver 520 may be set substantially equal to any one of 40 Ω, 48 Ω, 60 Ω, 80 Ω, 120Ω, and 240Ω according to a number of the pull-down transistor arrays PD0 to PD5 that are turned on. For example, when only a first pull-down transistor array PD0 is turned on and second to sixth pull-down transistor arrays PD1 to PD5 are turned off, the total impedance of the pull-down driver 520 is substantially equal to 240Ω. When the first pull-down transistor array PD0 and the second pull-down transistor array PD1 are turned on and the third to sixth pull-down transistor arrays PD2 to PD5 are turned off, the total impedance of the pull-down driver 520 is substantially equal to 120Ω. When all the pull-down transistor arrays PD0 to PD5 are turned on, the total impedance of the pull-down driver 520 is substantially equal to 40Ω.

When the output impedance (or the termination impedance) of the output driver 500 is determined to be any one of 40 Ω, 48 Ω, 60 Ω, 80 Ω, 120Ω, and 240Ω according to the reference impedance, the total impedance of the pull-up driver 510 and the total impedance of the pull-down driver 520 may be set to match a target output impedance. For example, in order to make the output impedance of the output driver 500 substantially equal to 40Ω, the total impedance of the pull-up driver 510 may be set to 80Ω and the total impedance of the pull-down driver 520 may be set to 40Ω. Furthermore, in order to make the output impedance of the output driver 500 substantially equal to 240Ω, the total impedance of the pull-up driver 510 may be set to 480Ω and the total impedance of the pull-down driver 520 may be set to 240Ω.

In an embodiment, values of calibration codes are adjusted to maintain a value of the total impedance of the pull-up driver 510 and a value of the total impedance of the pull-down driver 520 substantially constant, regardless of variations in temperature and process conditions. Values of the calibration codes may be adjusted according to variations in temperature and process conditions. In an embodiment, a first calibration code for the pull-up driver 510 has a first six-bit value (e.g., "000111") and a second calibration code for the pull-down driver 520 has a second sixth-bit value (e.g. "100011"). Each bit value of the first calibration code corresponds to that of the pull-up driving code PU_DC <0:5>, and each bit value of the second calibration code corresponds to that of the pull-down driving code PD_DC <0:5>. As a temperature of a semiconductor chip that includes the output driver 500 decreases, the decreased temperature may cause, for example, a change in the value of the total impedance of the pull-down driver 520. When the change is greater than a threshold value, in order to compensate for the change, the value of the second calibration code for the pull-down driver 520 is changed (e.g., from "100011" to "100010"). As a result, regardless of the decreased temperature, the impedance value of the pull-down driver 520 remains substantially constant.

In an embodiment, the output impedance of the output driver 500 is adjusted to a reference impedance value of the JEDEC LPDDR4 (Low Power Double Data Rate 4) standards. Consequently, it is possible to adjust the output impedance of the output driver 500 according to a reference impedance of other memory devices that comply with the JEDEC LPDDR 4 standards.

FIG. 3 is a table including values of driving control codes PUC and PDC for generating target output impedance values according to an embodiment.

As described above, in an embodiment, when the output impedance (e.g., termination impedance $R_{term}$) of an output driver (e.g., the output driver 500 of FIG. 2) is determined to be a target value, the total impedance R(PU) of a pull-up driver (e.g., the pull-up driver 510 of FIG. 2) and the total impedance R(PD) of a pull-down driver (e.g., the pull-down driver 520 of FIG. 2) are set according to the target value.

In an embodiment, the values <PUC0:PUC5> and <PDC0:PDC5> of the driving control codes PUC and PDC, which are capable of selectively driving one or more of the pull-up transistor arrays PU0 to PU5 and the pull-down transistor arrays PD0 to PD5 according to a target value $R_{term}$ of the output impedance, are set in advance as illustrated in the table of FIG. 3. Such driving control signals PUC and PDC, including values <PUC0:PUC5> and <PDC0:PDC5>, are respectively applied to a PU code generator (e.g., the PU code generator 410 of FIG. 1) and a PD code generator (e.g., the PD code generator 420 of FIG. 1).

In an embodiment, the pull-up driving control signal PUC and the pull-down driving control signal PDC have the same code value, and the driving control signals PUC and PDC are applied to the PU code generator 410 and the PD code generator 420, respectively. For example, in order to set the output impedance $R_{term}$ to 40Ω, the driving control signals PUC and PDC have the same code value of '111111,' and these driving control signals PUC and PDC are applied to the PU code generator 410 and the PD code generator 420, respectively. Moreover, in an embodiment, in order to set the output impedance $R_{term}$ to 240Ω, the driving control signals PUC and PDC have the same code value of '100000,' and these driving control signals PUC and PDC are applied to the PU code generator 410 and the PD code generator 420, respectively.

Figure 4:
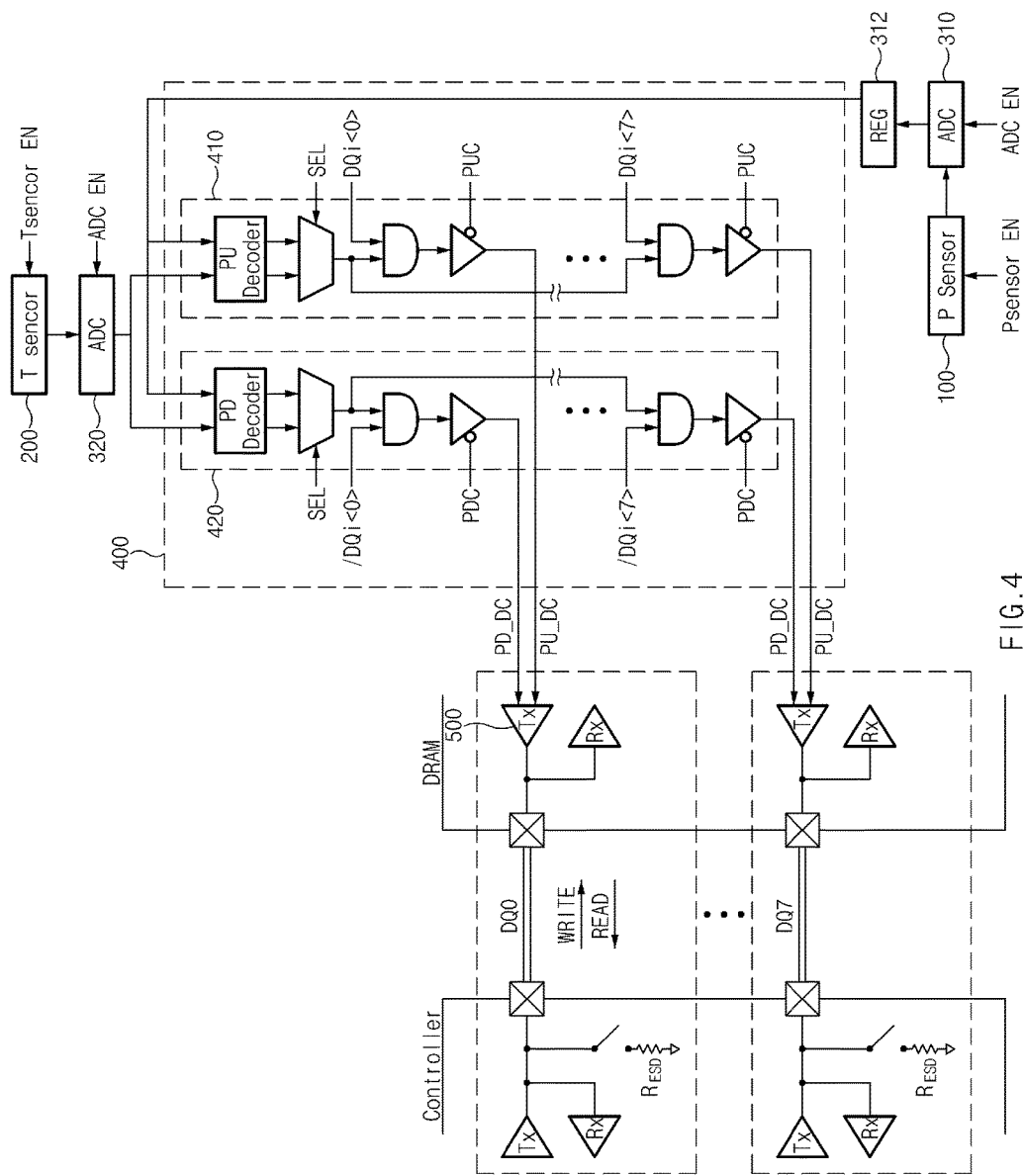
FIG. 4 illustrates the impedance calibration device of FIG. 1 and a memory controller implemented in one memory bank according to an embodiment.

FIG. 4 illustrates the impedance calibration device of FIG. 1 and a memory controller implemented in one memory bank according to an embodiment. An embodiment in which a DRAM is used as a semiconductor device will be described.

The DRAM and the controller are coupled to each other through data pads DQ0 to DQ7 and exchange bi-directional signals (e.g., a read signal and a write signal). Accordingly, a transmitter TX and a receiver RX are coupled to a corresponding one of the data pads DQ0 to DQ7 of the DRAM and the controller.

In the one memory bank, eight data pads DQ0 to DQ7 and one temperature monitoring sensor 200 are disposed. The temperature monitoring sensor 200 outputs an analog signal indicative of a temperature of the semiconductor device to an analog-to-digital converter (ADC) 320. In an embodiment, the ADC 320 outputs a signal indicative of one of values "00," "01," and "11" corresponding to a low temperature range (e.g., from −25° C. to 10° C.), a moderate temperature range (from 10° C. to 65° C.), and a high temperature range (from 65° C. to 125° C.), respectively.

Figure 5:
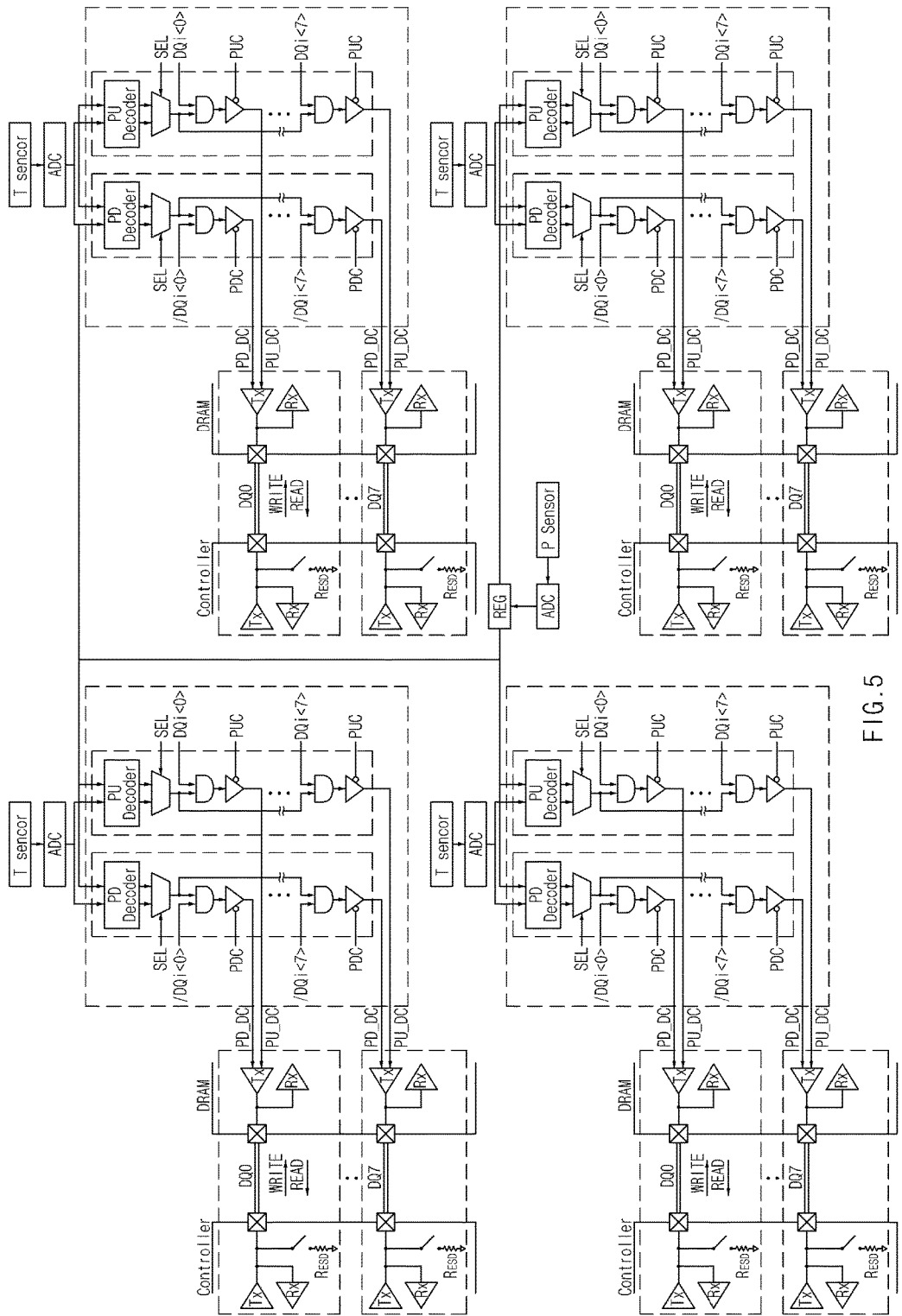
FIG. 5 illustrates a plurality of impedance calibration devices and a plurality of memory controller implemented in one die according to an embodiment.

In an embodiment, a single process sensor 100 may be shared by and used in an entire die. For example, FIG. 5 illustrates a plurality of impedance calibration devices and a plurality of memory controllers implemented in one die, and in an entire die, each of a plurality of temperature monitoring sensors may be used for a corresponding one of a plurality of banks and one process sensor may be shared by and used in the plurality of banks.

Referring back to FIG. 4, a process signal is converted into a digital signal, and a value corresponding to the digital signal may be stored in a register 312. Subsequently, the process sensor 100 and an A/D converter (ADC) 310 may be deactivated using signals Psensor EN and ADC EN. In an embodiment, the ADC 310 outputs a signal indicating one of values "00," "01," and "11" that corresponds to the fast, typical, and slow process corners, respectively.

In the PU code generator 410, a PU decoder decodes digital signals corresponding to a temperature signal and the process signal, and generates and outputs pull-up calibration codes for controlling the first pull-up transistor arrays PU0, PU2, and PU4, and the second pull-up transistor arrays PU1, PU3, and PU5. One of the pull-up calibration codes is selected by a selection signal SEL and the selected pull-up calibration code is input to AND gates together with data signals DQi<0:7>. The AND gates are used as pre-drivers. In the embodiment shown in FIG. 4, the pull-up calibration code is shared by the eight data pads DQ0 to DQ7. Each of the AND gates provides an output signal to a 3-phase buffer. The 3-phase buffer selectively outputs the output signal of a corresponding AND gate to the output driver 500 according to a corresponding value of the pull-up driving control signal PUC. For example, when the value of the pull-up driving control signal PUC is "1," the 3-phase buffer outputs the output signal of the AND gate to the output driver 500 as a signal indicative of the pull-up driving code PU_DC. However, when the value of the pull-up driving control signal PUC is "0," the 3-phase buffer outputs a signal indicative of high impedance.

In the PD code generator 420, a PD decoder decodes digital signals corresponding to the temperature signal and the process signal, and generates and outputs pull-down calibration codes for controlling the first pull-down transistor arrays PD0, PD2, and PD4, and the second pull-down transistor arrays PD1, PD3, and PD5. One of the pull-down calibration codes is selected by the selection signal SEL and the selected pull-down calibration code is input to AND gates together with inverted data signals /DQi<0:7>. The AND gates are used as pre-drivers. In the embodiment shown in FIG. 4, the pull-down calibration code is shared by the eight data pads DQ0 to DQ7. Each of the AND gates provides an output signal to a 3-phase buffer and the 3-phase buffer selectively outputs the output signal of the corresponding AND gate to the output driver 500 according to a corresponding value of the pull-down driving control signal PDC. For example, when the value of the pull-down driving control signal PDC is "1," the 3-phase buffer outputs the output signal of the AND gate to the output driver 500 as a signal indicative of the pull-down driving code PD_DC. However, when the value of the pull-down driving control signal PDC is "0," the 3-phase buffer outputs a signal indicative of high impedance.

Figure 6:
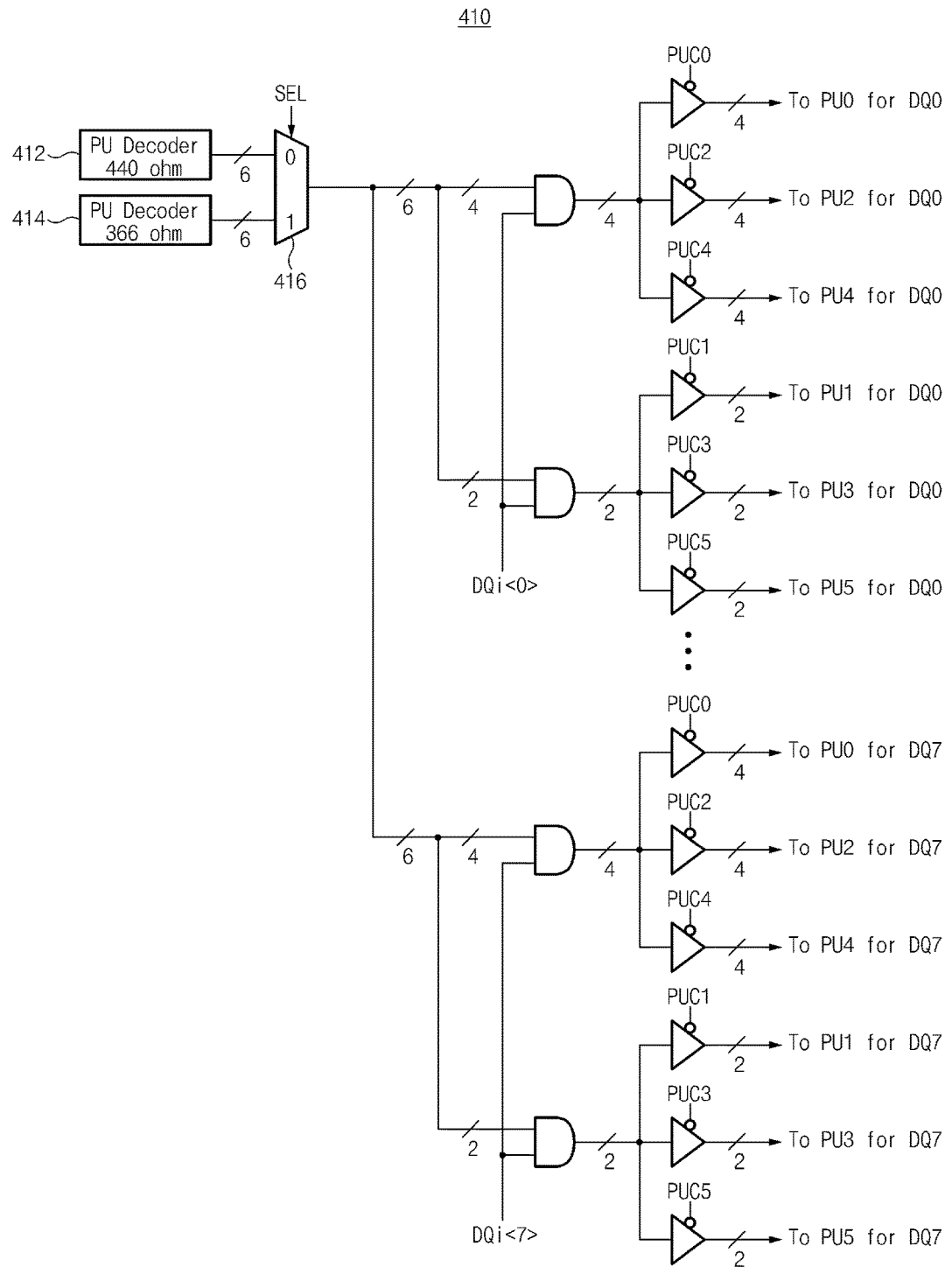
FIG. 6 is a circuit diagram illustrating a pull-up (PU) code generator shown in FIG. 4 according to an embodiment.

FIG. 6 is a circuit diagram illustrating a PU code generator 410 shown in FIG. 4 according to an embodiment.

The PU code generator 410 includes a first decoder 412 that generates calibration codes for the first pull-up transistor arrays PU0, PU2, and PU4 and a second decoder 414 that generates calibration codes for the second pull-up transistor arrays PU1, PU3, and PU5. In an embodiment, each of the first pull-up transistor arrays PU0, PU2, and PU4 has a resistance value substantially equal to 440Ω, and each of the second pull-up transistor arrays PU1, PU3, and PU5 has a resistance value substantially equal to 366Ω.

A multiplexer 416 selectively outputs one of the output signals of the decoders 412 or 414, indicative of the calibration codes for a transistor array of 440Ω or the calibration codes for a transistor array of 366Ω, respectively, according to the selection signal SEL. The selection signal SEL is determined according to a value of target output impedance (e.g., any one of 40 Ω, 48 Ω, 60 Ω, 80 Ω, 120Ω, and 240Ω. For example, when the value of the target output impedance is 240Ω, the selection signal SEL is set to select the output signal of the first decoder 412, and when the value of the target output impedance is 120Ω, the selection signal SEL is set to select the output signal of the second decoder 414. In an embodiment, as the selection signal SEL, a signal indicative of a second value PUC1 of the pull-up driving control signal PUC may be used except when the value of the target output impedance is 48Ω.

A signal indicative of the selected calibration code is input to an AND gate together with a corresponding one of the data signals DQi<0:7>, the AND gate performs an AND operation on the received signals, and then the AND gate outputs a signal indicative of the operation result to a 3-phase buffer. The 3-phase buffer outputs a signal indicative of the output value of the AND gate or outputs a signal indicative of high impedance by using a corresponding one of the pull-up driving control signals PUC0 to PUC5 as an enable signal. For example, when the enable signal is "1," the 3-phase buffer outputs the signal indicative of the output value of the AND gate, and when the enable signal is "0," the 3-phase buffer outputs the signal indicative of the high impedance.

Figure 7:
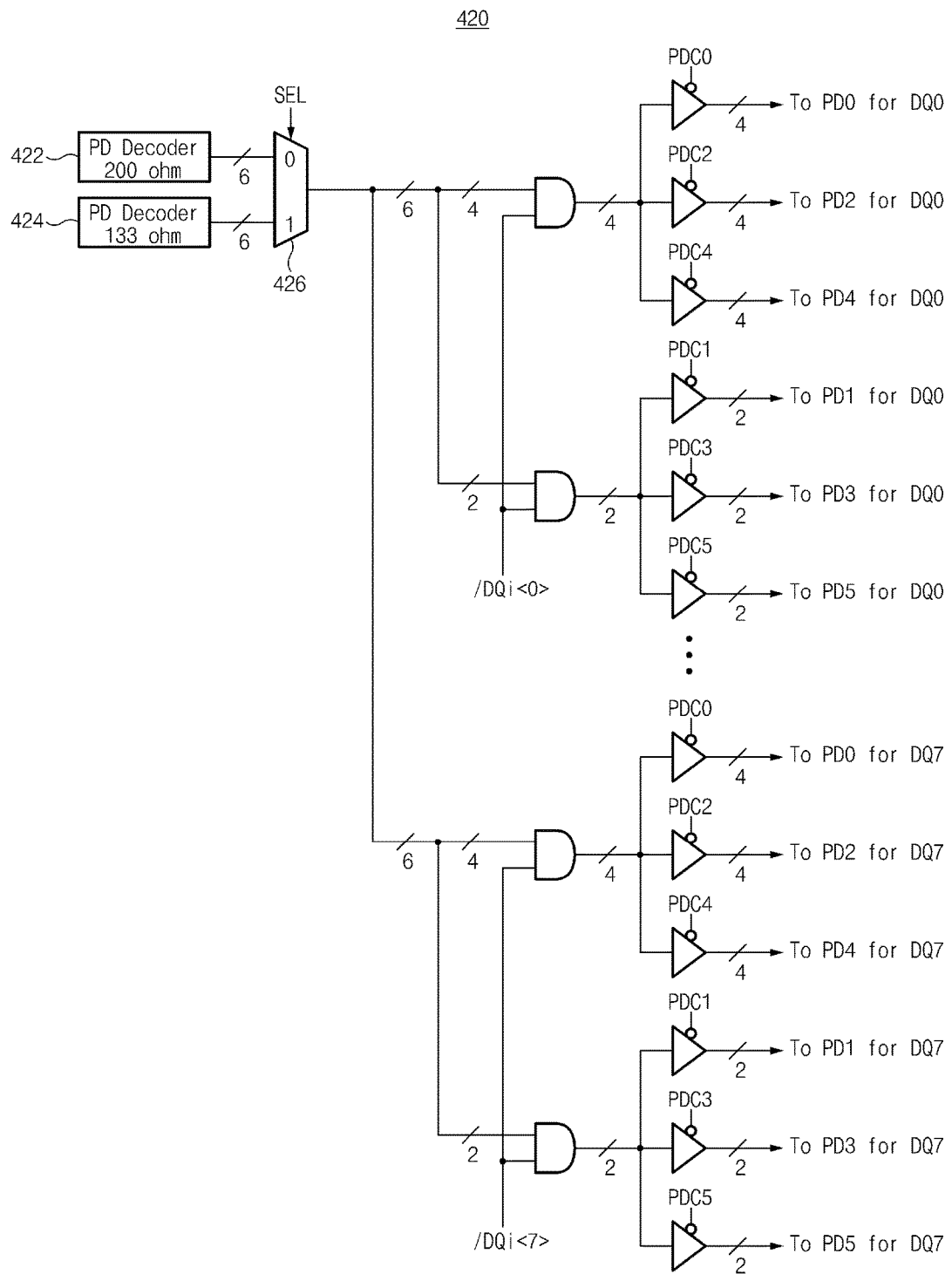
FIG. 7 is a circuit diagram illustrating a pull-down (PD) code generator shown in FIG. 4 according to an embodiment.

FIG. 7 is a circuit diagram illustrating a PD code generator 420 shown in FIG. 4 according to an embodiment.

The PD code generator 420 includes a first decoder 422 that generates calibration codes for the first pull-down transistor arrays PD0, PD2, and PD4 and a second decoder 424 that generates calibration codes for the second pull-down transistor arrays PD1, PD3, and PD5. In an embodiment, each of the first pull-down transistor arrays PD0, PD2, and PD4 has a resistance value substantially equal to 200Ω, and each of the second pull-down transistor arrays PD1, PD3, and PD5 has a resistance value substantially equal to 133Ω.

A multiplexer 426 selectively outputs one of the output signals of the decoders 422 or 424, indicative of the calibration codes for a transistor array of 200Ω or the calibration codes for a transistor array of 133Ω, respectively, according to the selection signal SEL. The selection signal SEL is determined according to a value of the target output impedance (e.g., any one of 40 Ω, 48 Ω, 60 Ω, 80 Ω, 120Ω, and 240Ω). For example, when the value of the target output impedance is 240Ω, the selection signal SEL is set to select the output signal of the first decoder 422, and when the value of the target output impedance is 120Ω, the selection signal SEL is set to select the output signal of the second decoder 424. In an embodiment, as the selection signal SEL, a signal indicative of a second value PDC1 of the pull-down driving control signal PDC may be used except when the value of the target output impedance is 48Ω.

A signal indicative of the selected calibration code is input to an AND gate together with a corresponding one of the inverted data signals /DQi<0:7>, the AND gate performs an AND operation on the received signals, and then the AND gate outputs a signal indicative of the operation result to a 3-phase buffer. The 3-phase buffer outputs a signal indicative of the output value of the AND gate or outputs a signal indicative of high impedance by using a corresponding one of the pull-down driving control signals PDC0 to PDC5 as an enable signal. For example, when the enable signal is "1," the 3-phase buffer outputs the signal indicative of the output value of the AND gate, and when the enable signal is "0," the 3-phase buffer outputs the signal indicative of the high impedance.

While various embodiments have been described above, it will be understood to those skilled in the art that the embodiments described are by way of example only. Accordingly, the impedance calibration device for a semiconductor device described herein should not be limited based on the described embodiments.

What is claimed is:

1. An impedance calibration device for a semiconductor device, the impedance calibration device comprising:
    a process sensor configured to detect a process condition for the semiconductor device and output a process signal;
    a temperature monitoring sensor configured to detect a temperature of the semiconductor device and output a temperature signal;
    a converter configured to convert the process signal and the temperature signal into a digital signal;
    a code generation circuit configured to generate and output a driving code for controlling a level of a voltage at an output node, using a data signal and the digital signal, the data signal being output through the output node; and
    an output driver configured to pull up or pull down the voltage at the output node according to the driving code.

2. The impedance calibration device for the semiconductor device of claim 1, wherein the process sensor is formed per die and is shared in the die.

3. The impedance calibration device for the semiconductor device of claim 1, wherein the temperature monitoring sensor corresponds to a memory bank.

4. The impedance calibration device for the semiconductor device of claim 1, wherein the code generation circuit selectively drives a plurality of transistor arrays coupled in parallel to one another in the output driver according to a driving control signal, the driving control signal being set according to a reference impedance.

5. The impedance calibration device for the semiconductor device of claim 4, wherein the code generation circuit turns on a transistor array among the plurality of transistor arrays according to the driving control signal, the digital signal of the converter, and the data signal.

6. The impedance calibration device for the semiconductor device of claim 5, wherein the code generation circuit decodes the digital signal of the converter to generate a calibration code, performs a logical operation on the calibration code and the data signal, and provides a signal corresponding to a result of the logical operation to a gate of the transistor array selected according to the driving control signal.

7. The impedance calibration device for the semiconductor device of claim 4, wherein the driving code includes a pull-up driving code and a pull-down driving code and the driving control signal includes a pull-up driving control signal and a pull-down driving control signal, and
    wherein the code generation circuit comprises:
        a pull-up code generator configured to generate the pull-up driving code according to the digital signal of the converter and the data signal and selectively output the pull-up driving code according to the pull-up driving control signal; and a pull-down code generator configured to generate the pull-down driving code according to the digital signal of the converter and an inverted version of the data signal and selectively output the pull-down driving code according to the pull-down driving control signal.

8. The impedance calibration device for the semiconductor device of claim 7, wherein the pull-up code generator comprises:

a pull-up decoder configured to decode the digital signal of the converter and generate a pull-up calibration code;

a logic operator configured to perform a logical operation on the pull-up calibration code and the data signal; and a buffer configured to selectively output an output signal of the logic operator according to the pull-up driving control signal.

9. The impedance calibration device for the semiconductor device of claim 8, wherein the buffer is a 3-phase buffer that outputs the output signal of the logic operator or a signal indicative of high impedance according to the pull-up driving control signal.

10. The impedance calibration device for the semiconductor device of claim 7, wherein the pull-down code generator comprises:

a pull-down decoder configured to decode the digital signal of the converter and generate a pull-down calibration code;

a logic operator configured to perform a logical operation on the pull-down calibration code and the inverted version of the data signal; and a buffer configured to selectively output an output signal of the logic operator according to the pull-down driving control signal.

11. The impedance calibration device for the semiconductor device of claim 10, wherein the buffer is a 3-phase buffer that outputs the output signal of the logic operator or a signal indicative of high impedance according to the pull-down driving control signal.

12. The impedance calibration device for the semiconductor device of claim 7, wherein the output driver comprises:

a pull-up driver configured to pull up the voltage at the output node according to the pull-up driving code; and a pull-down driver configured to pull down the voltage at the output node according to the pull-down driving code.

13. The impedance calibration device for the semiconductor device of claim 12, wherein the pull-up driver comprises:

a plurality of resistors each having a first end coupled to the output node;

a plurality of first pull-up transistor arrays each disposed between a second end of a corresponding one of the plurality of resistors and a power supply voltage; and a plurality of second pull-up transistor arrays each coupled in parallel to a corresponding one of the plurality of first pull-up transistor arrays.

14. The impedance calibration device for the semiconductor device of claim 13, wherein one of the plurality of first pull-up transistor arrays includes transistors that are coupled in parallel to one another and that are turned on or off according to a portion of the pull-up driving code.

15. The impedance calibration device for the semiconductor device of claim 14, wherein one of the plurality of second pull-up transistor arrays includes transistors that are coupled in parallel to one another and that are turned on or off according to the remaining portion of the pull-up driving code.

16. The impedance calibration device for the semiconductor device of claim 15, wherein the one of the first pull-up transistor arrays has a resistance value substantially equal to 440Ω when the transistors of the one of the first pull-up transistor arrays are turned on, and wherein the one of the second pull-up transistor arrays has a resistance value substantially equal to 366Ω when the transistors of the one of the second pull-up transistor arrays are turned on.

17. The impedance calibration device for the semiconductor device of claim 12, wherein the pull-down driver comprises:

a plurality of resistors each having a first end coupled to the output node;

a plurality of first pull-down transistor arrays each disposed between a second end of a corresponding one of the plurality of resistors and a ground voltage; and a plurality of second pull-down transistor arrays coupled in parallel to a corresponding one of the plurality of first pull-down transistor arrays.

18. The impedance calibration device for the semiconductor device of claim 17, wherein one of the plurality of first pull-down transistor arrays includes transistors that are coupled in parallel to one another and that are turned on or off according to a portion of the pull-down driving code.

19. The impedance calibration device for the semiconductor device of claim 18, wherein one of the plurality of second pull-down transistor arrays includes transistors that are coupled in parallel to one another and that are turned on or off according to the remaining portion of the pull-down driving code.

20. The impedance calibration device for the semiconductor device of claim 19, wherein the one of the first pull-down transistor arrays has a resistance value substantially equal to 200Ω when the transistors of the one of the first pull-down transistor arrays are turned on, and wherein the one of the second pull-down transistor arrays has a resistance value substantially equal to 133Ω when the transistors of the one of the second pull-down transistor arrays are turned on.

* * * * *